United States Patent
Zhong et al.

(10) Patent No.: US 10,032,860 B2
(45) Date of Patent: Jul. 24, 2018

(54) SEMICONDUCTOR DEVICE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Jizhe Zhong, Shanghai (CN); Zhihua Wu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/286,176

(22) Filed: Oct. 5, 2016

(65) Prior Publication Data

US 2017/0170263 A1 Jun. 15, 2017

(30) Foreign Application Priority Data

Dec. 11, 2015 (CN) .......................... 2015 1 0920864

(51) Int. Cl.
| | |
|---|---|
| *H01L 21/8234* | (2006.01) |
| *H01L 29/06* | (2006.01) |
| *H01L 21/265* | (2006.01) |
| *H01L 21/74* | (2006.01) |
| *H01L 21/768* | (2006.01) |

(Continued)

(52) U.S. Cl.
CPC ........ *H01L 29/0623* (2013.01); *H01L 21/265* (2013.01); *H01L 21/74* (2013.01); *H01L 21/76895* (2013.01); *H01L 23/535* (2013.01); *H01L 23/552* (2013.01); *H01L 23/585* (2013.01); *H01L 29/0649* (2013.01); *H01L 29/36* (2013.01)

(58) Field of Classification Search
CPC ......... H01L 21/823481; H01L 23/5225; H01L 27/0248
See application file for complete search history.

(56) References Cited

U.S. PATENT DOCUMENTS

2006/0102980 A1* 5/2006 Nakashiba ...... H01L 21/823878
257/508
2009/0294929 A1* 12/2009 Lee .................... H01L 23/5225
257/659

* cited by examiner

*Primary Examiner* — Thomas L Dickey
(74) *Attorney, Agent, or Firm* — Anova Law Group, PLLC

(57) ABSTRACT

A semiconductor device and a fabrication method are provided. The semiconductor device is fabricated by providing a substrate with a device area surrounded by a seal ring area, forming a buried deep-well layer in the substrate of the seal ring area, forming a first well region and a second well region in the substrate above the buried deep-well layer with the first well region surrounding the device area and the second well region surrounding the first well region, forming a heavily doped region in the substrate above the buried deep-well layer and between the first well region and the second well region, and forming a seal ring structure connecting to the heavily doped region. The buried deep-well layer, the first well region, and the second well region all have a first doping type while the heavily doped region and the substrate have a second doping type.

20 Claims, 6 Drawing Sheets

(51) Int. Cl.
*H01L 23/535* (2006.01)
*H01L 29/36* (2006.01)
*H01L 23/552* (2006.01)
*H01L 23/58* (2006.01)

SEMICONDUCTOR DEVICE AND FABRICATION METHOD THEREOF

CROSS-REFERENCES TO RELATED APPLICATIONS

This application claims the priority of Chinese Patent Application No. CN201510920864.X, filed on Dec. 11, 2015, the entire content of which is incorporated herein by reference.

FIELD OF THE DISCLOSURE

The present disclosure generally relates to the field of semiconductor fabrication technology and, more particularly, relates to a semiconductor device and fabrication methods thereof.

BACKGROUND

Seal ring structure of semiconductor device is mainly used to protect the chip of the semiconductor device from being damaged during dicing process. Specifically, seal ring structure may prevent damages to the chip due to cracks generated by dicing blades.

Usually, the seal ring structure is a metal shielding ring formed by overlapped contact holes, through vias, and metal layers. The seal ring structure may be formed at a position with a certain distance away from the chip, and may also keep a certain distance away from the dicing path. For different devices, the distance between the seal ring structure and the chip, and the distance between the seal ring structure and the dicing path may be different.

In addition to providing protection for the chip during dicing process, seal ring structure may also play other roles. For example, the seal ring structure may shield noise signals coming from outside of the chip; and the seal ring structure may also prevent moisture from entering the chip through fracture surfaces on the edges.

However, seal ring structures fabricated by existing methods may cause degradation of electrical performance of semiconductor devices. The disclosed fabrication method and semiconductor structure are directed to solve one or more problems set forth above and other problems in the art.

BRIEF SUMMARY OF THE DISCLOSURE

One aspect of the present disclosure includes a method for fabricating a semiconductor device. The method includes providing a substrate including a device area and a seal ring area surrounding the device area, and forming a buried deep-well layer in the substrate of the seal ring area to surround the device area. The buried deep-well layer has a first doping type different from a second doping type of the substrate. The method also includes forming a first well region and a second well region in the substrate above the buried deep-well layer in the seal ring area with the first well region surrounding the device area and the second well region surrounding the first well region. Each of the first well region and the second well region connects with the buried deep-well layer and extends to the surface of the substrate. In addition, each of the first well region and the second well region has the first doping type. The method further includes forming a heavily doped region in the portion of the substrate above the buried deep-well layer and between the first well region and the second well region. The heavily doped region has the second doping type. Finally, the method includes forming a seal ring structure on the substrate of the seal ring area with the seal ring structure connected to the heavily doped region.

Another aspect of the present disclosure provides a semiconductor device. The semiconductor structure includes a substrate including a device area and a seal ring area surrounding the device area, a buried deep-well layer formed in the substrate of the seal ring area to surround the device area, a first well region and a second well region formed in the substrate above the buried deep-well layer in the seal ring area with the first well region surrounding the device area and the second well region surrounding the first well region, and a heavily doped region formed in a portion of the substrate above the buried deep-well layer and between the first well region and the second well region. Each of the first well region and the second well region connects with the buried deep-well layer and extends to the surface of the substrate. The buried deep-well layer has a first doping type different from a second doping type of the substrate. Each of the first well region and the second well region has the first doping type. The heavily doped region has the second doping type. The semiconductor structure further includes a seal ring structure formed on the substrate of the seal ring area with the seal ring structure connected to the heavily doped region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
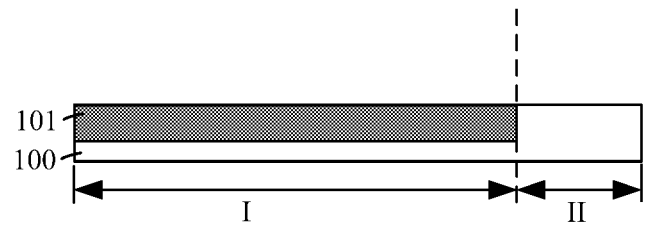
FIGS. 1-3 illustrate schematic views of semiconductor structures corresponding to certain stages of an existing fabrication method.
Figure 2:
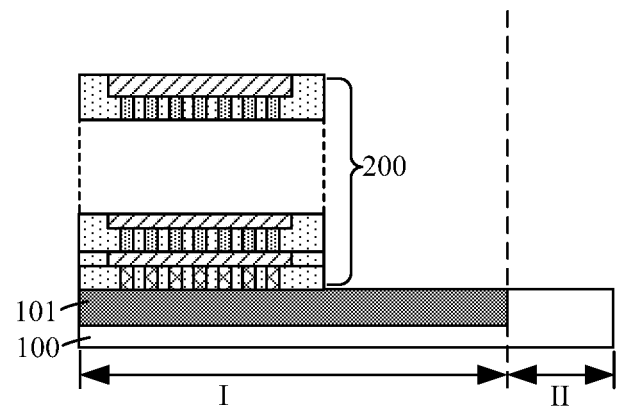
Figure 3:
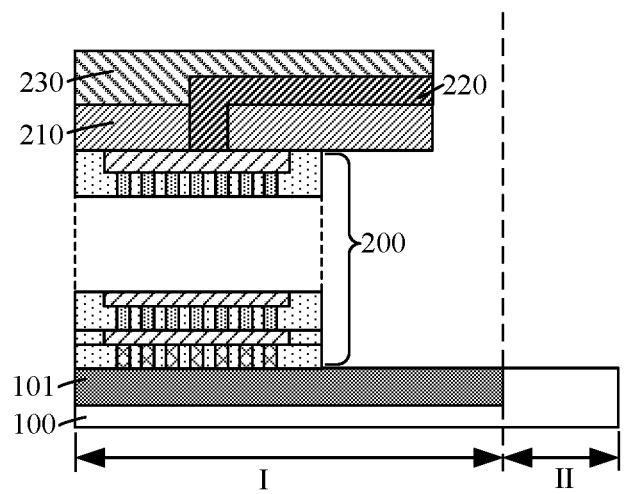

FIGS. 1-3 show schematic views of semiconductor structures corresponding to certain stages according to an existing fabrication method. The existing fabrication method includes the following steps. First, as shown in FIG. 1, a substrate 100 is provided. The substrate 100 includes a seal ring area I and a device area II. The seal ring area I surrounds the device area II. A heavily doped region 101 is formed in the substrate 100 of the seal ring area I. The type of ions doped in the heavily doped region 101 is the same as the type of ions doped in the substrate 100. Further, as shown in FIG. 2, after forming the heavily doped region 101, a seal ring structure 200 is formed on the substrate 100 of the seal ring area I. Finally, referring to FIG. 3, a first passivation layer 210, a connection metal layer 220, and a second passivation layer 230 are sequentially formed on the surface of the seal ring structure 200. Specifically, the second passivation layer 230 covers the connection metal layer 220, and the connection metal layer 220 is not electrically grounded.

Radio frequency (RF) device is usually located in the seal ring area I, which may surround the device area II. The RF device may include noise-generating components such as inductors and capacitors. Further, the doping type of the heavily doped region 101 may be the same as the doping type of the substrate 100. That is, the heavily doped region 101 may be connected to the substrate 100 of the seal ring area I and the device area II, and the seal ring area I may be defined on a same substrate 100. Therefore, when the inductors and capacitors are close to the seal ring area I and the device area II, noise signals generated by RF devices may easily enter the substrate 100 through the seal ring structure 200, and thus may affect the electrical performance of other electronic components.

Figure 11:
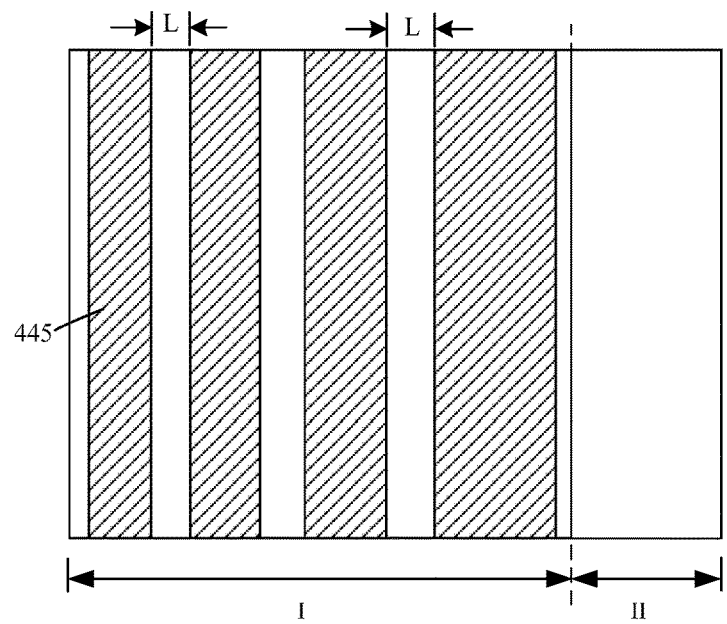
Figure 12:
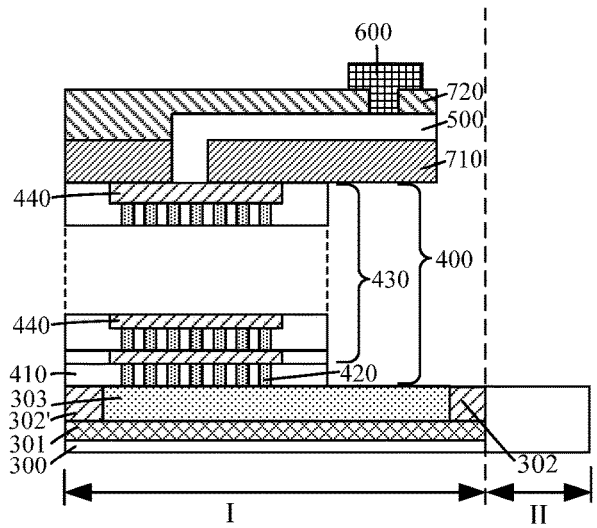
Figure 13:
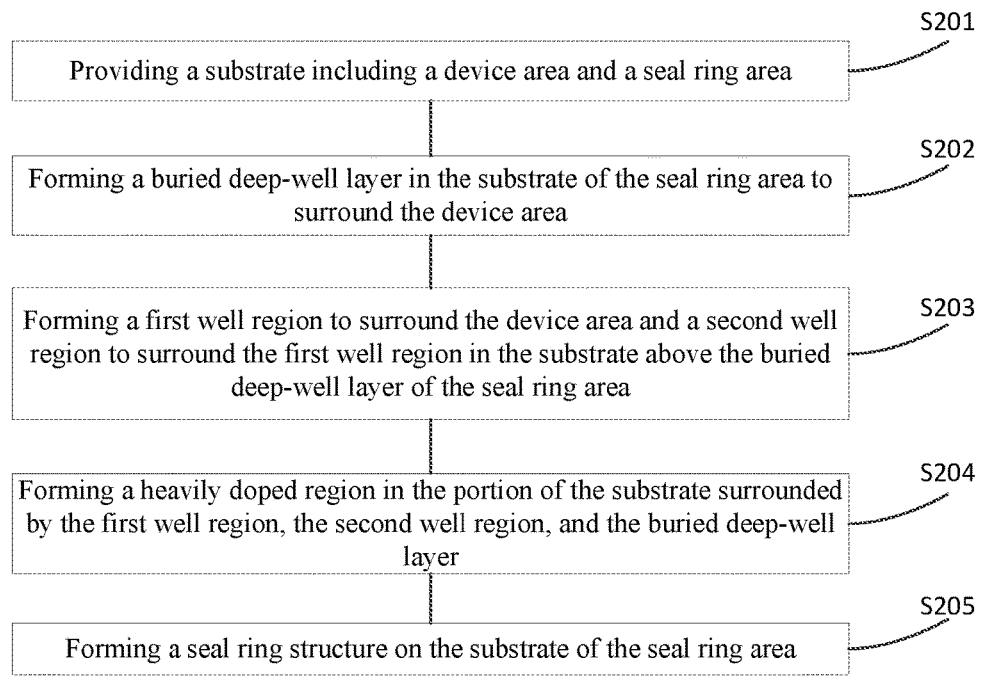
FIG. 13 illustrates a flowchart of the exemplary fabrication process consistent with disclosed embodiments.

The present disclosure provides a method for fabricating a semiconductor structure. FIG. 13 shows a flowchart of an exemplary fabrication method consistent with disclosed embodiments. FIGS. 4-12 show schematic views of semiconductor structures corresponding to certain stages of the exemplary fabrication method.

Figure 4:
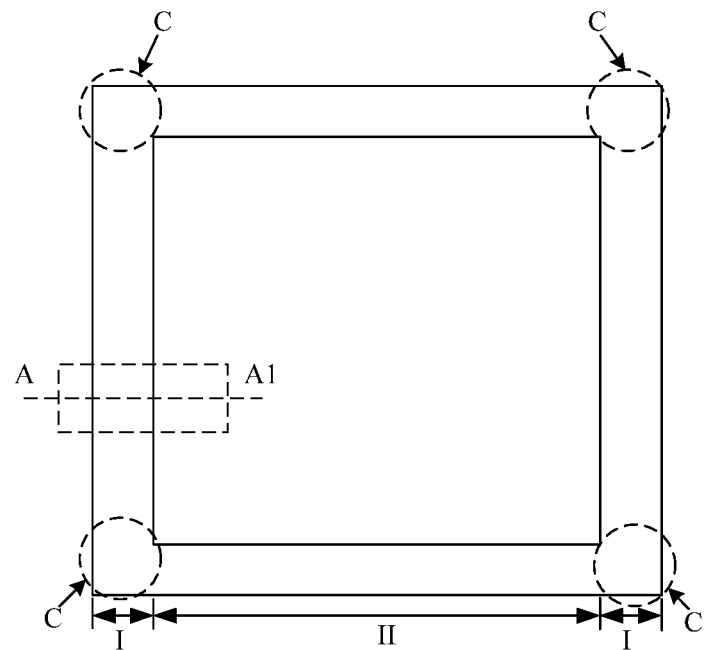
FIGS. 4-12 illustrate schematic views of semiconductor structures corresponding to certain stages of an exemplary fabrication method consistent with disclosed embodiments.
Figure 5:
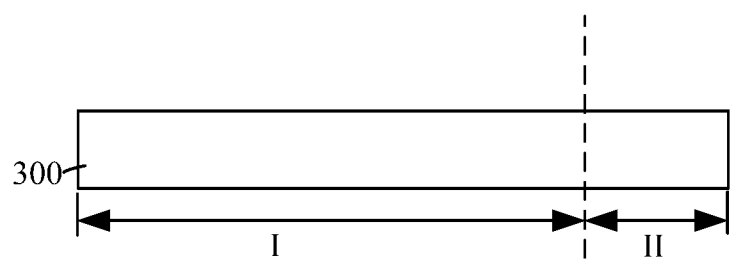

Referring to FIG. 13, at the beginning of the fabrication process, a substrate including a device area and a seal ring area is provided (S201). FIG. 4 shows a schematic top view of a semiconductor substrate consistent with disclosed embodiment. FIG. 5 shows a schematic cross-section view of a portion of the semiconductor substrate along AA1 direction in FIG. 4.

Referring to FIG. 4 and FIG. 5, a substrate 300 is provided. The substrate 300 may be doped. The substrate 300 may further include a seal ring area I and a device area II. The seal ring area I may surround the device area II.

The substrate 300 may provide a process platform for subsequent formation of device structures. The substrate 300 may be made of Si, Ge, SiGe, SiC, GaAs, and/or InAs. The substrate 300 may also be made of silicon on insulator (SOD, germanium on insulator (GOI), or any other appropriate semiconductor compound. In one embodiment, the substrate 300 is made of silicon and the doping type of the substrate 300 is p-type.

Referring to FIG. 4, the seal ring area I may have a square shape and may include four corner regions C. The AA1 line may not include any of the four corner regions. A cross-section view of the substrate along the AA1 line is shown in FIG. 5. Further, FIGS. 6-9 and 12 all show schematic cross-section views of semiconductor structures along the AA1 line at certain stages of the fabrication process.

Figure 6:
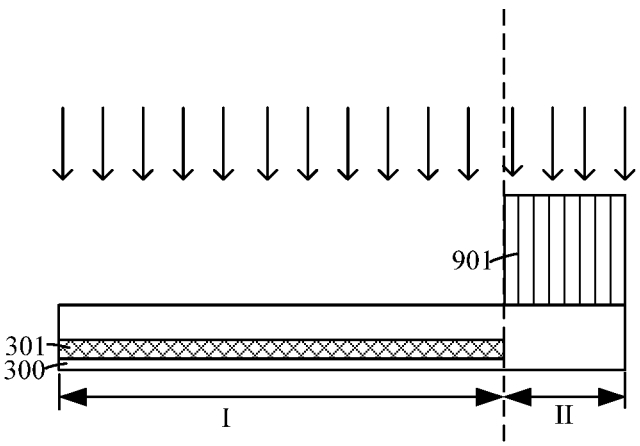

Returning to FIG. 13, further, a buried deep-well layer surrounding the device area may be formed in the substrate of the seal ring area (S202). FIG. 6 shows a schematic view of a corresponding semiconductor structure.

Referring to FIG. 6, a buried deep-well layer 301 is formed in the substrate 300 of the seal ring area I. The buried deep-well layer 301 may surround the device area II. The buried deep-well layer 301 may be doped. The doping type of the buried deep-well layer 301 may be different from the doping type of the substrate 300.

The buried deep-well layer 301 together with a subsequently-formed well region may be used to isolate the substrate 300 of the seal ring area I from the device area II. Further, isolating the substrate 300 of the seal ring area I from other components formed in the device area II may suppress or prevent the influence of noise signal on the electrical performance of other components through the substrate 300.

In one embodiment, the doping ions in the substrate 300 may be p-type. Therefore, the buried deep-well layer 301 may be doped with n-type ions. The buried deep-well layer 301 that surrounds the device area II may be formed by performing a first ion implantation process on the substrate 300 of the seal ring area I.

Specifically, the seal ring area I may have a square shape and may include four corner regions C (shown in FIG. 4). The first ion implantation process performed on the substrate 300 of the seal ring area I may include the following steps. First, a first patterned layer 901 may be formed on the surface of the substrate. The first patterned layer 901 may cover the device area II and the four corner regions C of the seal ring area I (shown in FIG. 4). Then the first ion implantation process may be performed on the substrate 300 exposed by the first patterned layer 901 to form a buried deep-well layer 301 in the substrate of the seal ring area I. Finally, the first patterned layer 901 may be removed.

In one embodiment, the parameters of the first ion implantation process may include: implanting ions including phosphor ions, arsenic ions, and antimony ions; an implanting energy in a range of 100 keV to 1000 keV; and an implanting dosage in a range of 1E12 atoms/cm$^2$ to 1E14 atoms/cm$^2$.

In one embodiment, the first patterned layer 901 is a photoresist layer. After forming the buried deep-well layer 301, the first patterned layer 901 may be removed by a wet etching process or an ashing process.

Figure 7:
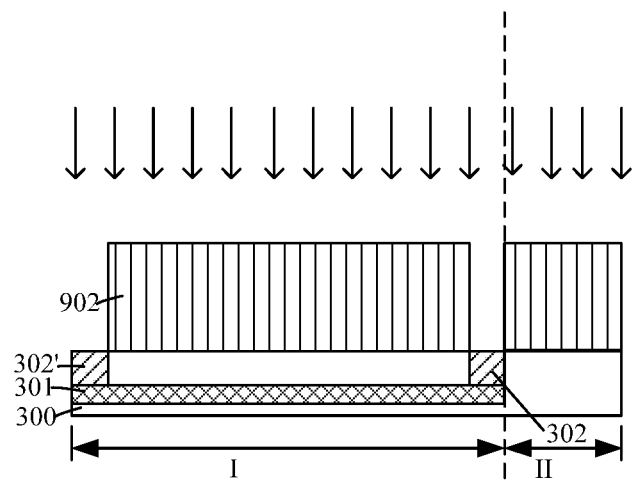

Further, returning to FIG. 13, a first well region surrounding the device area and a second well region surrounding the first well region may be formed in the substrate above the buried deep-well layer of the seal ring area (S203). FIG. 7 shows a schematic view of the corresponding semiconductor structure.

Referring to FIG. 7, a first well region 302 may be formed in the substrate 300 above the buried deep-well layer 301 of the seal ring area I. The first well region 302 may surround the device area II. A second well region 302' may be formed in the substrate 300 above the buried deep-well layer 301 to surround the first well region 302. The first well region 302 and the second well region 302' may both connect with the buried deep-well layer 301 and extend to the surface of the substrate 300. The doping type of the first well region 302 and the second well region 302' may be different from the doping type of the substrate 300.

The first well region 302, the second well region 302', and the buried deep-well layer 301 may form an anti-jamming barrier to isolate the substrate 300 of the seal ring area I from other components formed in the device area II. As such, influence of noise signal to the electrical performance of the components through the substrate 300 may be suppressed or prevented.

In one embodiment, the doping ions in the substrate 300 may be p-type. Therefore, the doping ions in the first well region 302 and the second well region 302' may be n-type. The formation process for the first well region 302 and the second well region 302' may include performing a second ion implantation process on the substrate 300 of the seal ring area I so that a first well region 302 surrounding the device area II and a second well region 302' surrounding the first well region 302 may be formed.

Specifically, the seal ring area I may have a square shape and may include four corner regions C (shown in FIG. 4). The second ion implantation process performed on the substrate 300 of the seal ring area I may include the following steps. First, a second patterned layer 902 may be formed on the surface of the substrate 300. The second patterned layer 902 may cover the device area II and a portion of the surface of the substrate 300 in the seal ring area I including the corner regions C (shown in FIG. 4). The second patterned layer 902 may expose only a portion of the surface of the substrate 300 above the buried deep-well layer 301. Then, the second ion implantation process may be performed on the portion of the substrate 300 exposed by the second patterned layer 902 to form a first well region 302 and a second well region 302' in the substrate 300 above the buried deep-well layer 301 of the seal ring area I. The first well region 302 may surround the device area II while the second well region 302' may surround the first well region 302. The first well region 302 and the second well region 302' may both connect with the buried deep-well layer 301 and extend to the surface of the substrate 300. Finally, the second patterned layer 902 may be removed.

In one embodiment, the parameters of the second ion implantation process may include: implanting ions including phosphor ions, arsenic ions, and antimony ions; an implanting energy in a range of 100 keV to 500 keV; and an implanting dosage in a range of 5E12 atoms/cm$^2$ to 1E14 atoms/cm$^2$.

In one embodiment, the second patterned layer 902 is a photoresist layer. After forming the first well region 302 and the second well region 302', the second patterned layer 902 may be removed by a wet etching process or an ashing process.

Specifically, the buried deep-well layer 301, the first well region 302, and the second well region 302' may not be formed in the corner regions C (shown in FIG. 4) of the seal ring area I. That is, no anti jamming barrier, which includes the buried deep-well layer 301, the first well region 302, and the second well region 302', may be formed in the corner regions C. The seal ring structure formed in the corner regions C may be connected to the substrate 300. Therefore, plasma may be released through the seal ring structure in the corner region C, thus damages to the devices due to accumulation of plasma may be avoided.

Figure 8:
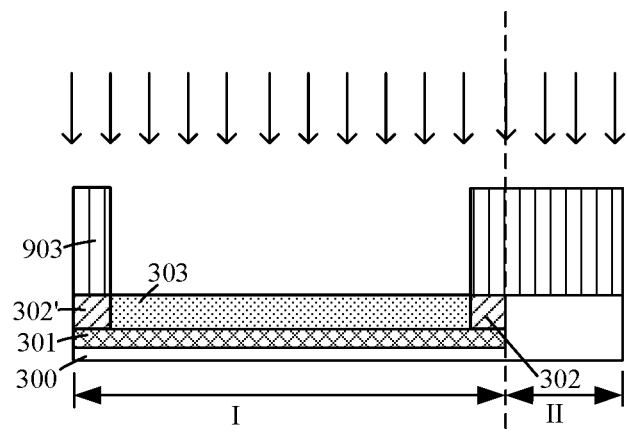

Further, returning to FIG. 13, a heavily doped region may be formed in the portion of the substrate surrounded by the first well region, the second well region, and the buried deep-well layer (S204). FIG. 8 shows a schematic view of the corresponding semiconductor structure.

Referring to FIG. 8, a heavily doped region 303 may be formed in the portion of the substrate 300 surrounded by the first well region 302, the second well region 302', and the buried deep-well layer 301.

In one embodiment, the doping ions in the substrate 300 may be p-type. Correspondingly, the doping ions in the heavily doped region 303 may also be p-type. The heavily doped region 303 may be formed by a heavy doping implantation process.

Specifically, the heavy doping implantation process may include the following steps. First, a third patterned layer 903 may be formed on the surface of the substrate 300. The third patterned layer 903 may cover the device area II, the four corner regions C (shown in FIG. 4) of the seal ring area I, the first well region 302, and the second well region 302'. The third patterned layer 903 may expose the surface of the portion of the substrate 300 between the first well region 302 and the second well 302'. Further, a heavy doping implantation process may be performed on the portion of the substrate 300 exposed by the third patterned layer 903 to form the heavily doped region 303. Finally, the third patterned layer 903 may be removed.

In one embodiment, the parameters of the heavy doping implantation process may include: implanting ions including boron ions, gallium ions, and indium ions; an implanting energy in a range of 1 keV to 100 keV; and an implanting dosage in a range of 5E14 atoms/cm$^2$ to 1E16 atoms/cm$^2$.

In one embodiment, the third patterned layer 903 is a photoresist layer. After forming the heavily doped region 303, the third patterned layer 903 may be removed by a wet etching process or an ashing process.

Specifically, the buried deep-well layer 301, the first well region 302, and the second well region 302' may surround the heavily doped region 303. That is, the buried deep-well layer 301, the first well region 302, and the second well region 302' together may form an anti jamming barrier. As the doping type of the buried deep-well layer 301, the first well region 302, and the second well region 302' may be different from the doping type of the substrate 300, the anti jamming barrier may isolate the substrate 300 of the seal ring area I from other components formed in the device area II. Therefore, the anti jamming barrier may prevent noise signals from entering the substrate 300 through the seal ring structure and affecting the electrical performance of the other components.

Figure 9:
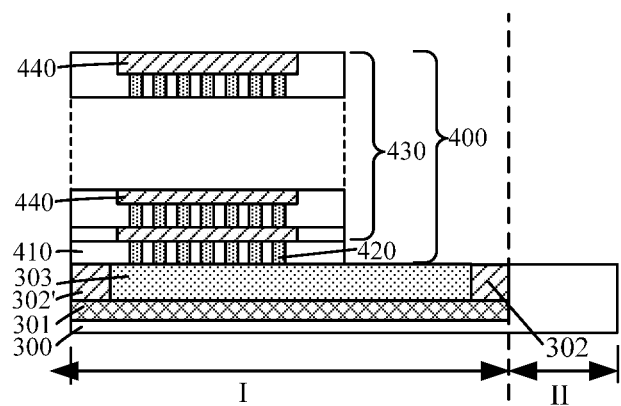

Further, returning to FIG. 13, a seal ring structure may be formed on the substrate (S205). FIG. 9 shows a schematic view of the corresponding structure.

Referring to FIG. 9, a seal ring structure 400 is formed on the substrate 300. The seal ring structure 400 may connect with the heavily doped region 303.

In one embodiment, the seal ring structure 400 may be formed on the substrate 300 by a process including the following steps. First, an interlayer dielectric layer 410 may be formed on the surface of the substrate 300 in the seal ring area I. Then, a plurality of contact hole plugs 420 may be formed in the interlayer dielectric layer 410. The plurality of contact hole plugs 420 may be formed through the entire thickness of the interlayer dielectric layer 410 and may connect with the heavily doped region 303. Further, a metal interconnection layer 430 may be formed on the surface of the interlayer dielectric layer 410. The metal interconnection layer 430 may connect with the plurality of contact hole plugs 420.

In one embodiment, the interlayer dielectric layer 410 may have a multiple-layer structure including a first interlayer dielectric layer (not shown) formed on the substrate 300 of the seal ring area I and a second interlayer dielectric layer (not shown) formed on the first interlayer dielectric layer.

The interlayer dielectric layer 410 may serve as an isolation structure between neighboring contact hole plugs 420. The interlayer dielectric layer 410 may also serve as an isolation structure between the metal interconnection layer 430 and the substrate 300.

The first interlayer dielectric layer may be made of an insulating material such as $SiO_x$, SiN, SiON, SiCO, SiCN, SiCON, etc. In one embodiment, the first interlayer dielectric layer may be formed by a fluid chemical vapor deposition (FCVD) method; and the first interlayer dielectric layer may be made of $SiO_x$.

The density of the second interlayer dielectric layer may be larger than the density of the first interlayer dielectric layer. The second interlayer dielectric layer may be more electrically insulating as compared to the first interlayer dielectric layer so that the subsequently-formed isolation structure may have desired insulation properties. The second interlayer dielectric layer may be made of an insulating material such as $SiO_x$, SiN, SiON, SiCO, SiCN, SiCNO, etc.

In one embodiment, the second interlayer dielectric layer may be formed by a high aspect ratio process (HARP) deposition. The second interlayer dielectric layer may be made of $SiO_x$. Specifically, the interlayer dielectric layer 410 may be formed by a process including the following steps. First, a first interlayer dielectric layer may be formed on the surface of the substrate of the seal ring area I. Then, a second interlayer dielectric film may be formed on the surface of the first interlayer dielectric layer. Finally, a planarization process may be performed on the second interlayer dielectric film to form a second interlayer dielectric layer as the thickness of the second interlayer dielectric film reaches a pre-determined value.

In one embodiment, the planarization process may use a chemical mechanical polishing (CMP) method to reduce the thickness of the second interlayer dielectric film to a desired value and thus form the second interlayer dielectric layer.

The plurality of contact hole plugs 420 may be used to realize electrical connection between the substrate 300 and the metal interconnection layer 430.

Specifically, the plurality of contact hole plugs 420 may be formed by a method including the following steps. First, a patterned layer (not shown) may be formed on the surface of the interlayer dielectric layer 410. The patterned layer may contain a contact hole pattern. Then, a plurality of contact holes (not shown) may be formed by etching the interlayer dielectric layer 410 along the contact hole pattern using the patterned layer as an etch mask. Further, the plurality of contact holes may be filled with a conductive material. The conductive material may also cover the surface of the interlayer dielectric layer 410. Finally, a planarization process may be performed on the conductive material. Specifically, the portion of the conductive material formed on the surface of the interlayer dielectric layer 410 may be removed until the conductive material formed in the interlayer dielectric layer 410 reaches a desired thickness. As such, a plurality of contact hole plugs 420 may be formed through the entire thickness of the interlayer dielectric layer 410.

In one embodiment, the interlayer dielectric layer 410 may be etched by a plasma dry etching process to form the plurality of contact holes. In addition, a CMP method may be adopted to remove the portion of the conductive material formed on the surface of the interlayer dielectric layer 410 until the conductive material formed in the interlayer dielectric layer 410 reaches a desired thickness.

The plurality of contact hole plugs 420 may be made of Cu and/or W. In one embodiment, the plurality of contact hole plugs 420 is made of W.

Further, the formation process for the metal interconnection layer 430 may include forming multiple metal layers 440.

Figure 10:
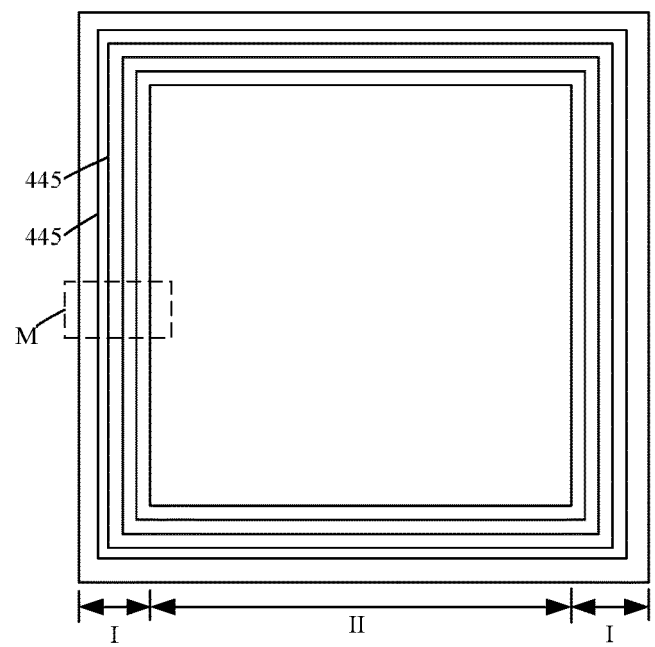

FIG. 10 shows a schematic top view of the structure shown in FIG. 9 from the side of the multiple metal layers 440. A dashed frame M in FIG. 10 contains a portion of the structure. FIG. 11 shows a zoomed-in view of the portion of the structure shown in the dashed frame M in FIG. 10. The formation process for each metal layer 440 may include forming multiple circles of metal lines 445 on the interlayer dielectric layer 410 to surround the device area II. Along a direction parallel to the substrate 300, a distance L (shown in FIG. 11) between neighboring circles of the metal lines 445 may be pre-defined.

In one embodiment, the multiple circles of metal lines 445 of the metal layer 440 may be uniformly distributed. That is, the pre-determined distance L between different neighboring circles of the metal lines 445 may be constant.

The multiple metal layers 440 including the multiple circles of metal lines 445 may be used to eliminate noise signals. Specifically, after noise signals from RF devices enter the seal ring structure, the noise signals may gradually diminish while passing through the multiple circles of metal lines 445. Therefore, noise signals may not be transmitted in the metal interconnection layer 430, thus the ability of the seal ring structure in resisting noise signals may be further improved.

Moreover, the pre-determined distance L may not be very small or excessively large. When the pre-determined distance L is too small, the actual fabrication process may be very difficult and neighboring circles of metal lines 445 may easily connect with each other, affecting the quality of the seal ring structure. On the other hand, when the pre-determined distance L is excessively large, the number of circles allowed for metal lines 445 formed in the seal ring area I may not be large enough to efficiently eliminate noise signals. In one embodiment, the pre-determined distance L is in a range of 500 μm to 1000 μm; and the number of circles of metal lines 445 formed in the seal ring area I is 4.

The metal interconnection layer 430 may be made of Cu, W, and/or Al. In one embodiment, the metal interconnection layer 430 is made of Cu.

In one embodiment, the metal interconnection layer 430 may include more than one metal layers 440. Correspondingly, referring to FIG. 9, more than one interlayer dielectric layer may be formed between neighboring metal layers 440. In addition, a plurality of contact hole plugs may also be formed each interlayer dielectric layer to provide electrical connection between neighboring metal layers. The fabrication process for the interlayer dielectric layer formed between neighboring metal layers 440 may be similar to the fabrication process for the interlayer dielectric layer 410 while the fabrication process for the plurality of contact hole plugs in each of the interlayer dielectric layer may be similar to the fabrication process for the plurality of contact hole plugs 420 formed in the interlayer dielectric layer 410.

Further, returning to FIG. 13, after forming the seal ring structure, a connection metal layer may be formed on the surface of the seal ring structure. FIG. 12 shows a schematic cross-section view of a corresponding semiconductor structure.

Referring to FIG. 12, a connection metal layer 500 may be formed on the surface of the seal ring structure 400. Further, the connection metal layer 500 may be connected to ground through another connection metal layer 600.

The connection metal layer 500 may be used to electrically connect different components in the seal ring region I and also connect components to external electric circuits. In one embodiment, the connection metal layer 500 may be made of Al.

Further, prior to the formation of the connection metal layer 500 on the surface of the seal ring structure 400, the fabrication method may also include the following steps. First, a second passivation layer 720 may be formed on the surface of the connection metal layer 500. An opening (not shown) may be formed in the second passivation layer 720. The opening may expose a portion of the connection metal layer 500. Finally, the connection metal layer 500 may be connected to another connection metal layer 600 through the opening and the connection metal layer 600 may be grounded.

Because noise signals may originate from the potential difference between a high voltage and a low voltage, by connecting the connection metal layer 500 to ground through the connection metal layer 600, potential difference in the seal ring structure 400 may be avoided. Therefore, noise signals may not be generated, thus the electrical performance of semiconductor device may be improved.

The present disclosure also provides a semiconductor device. The semiconductor device may be formed by the fabrication method described above. FIG. 12 shows a schematic cross-section view of a semiconductor device consistent with disclosed embodiments.

Referring to FIG. 12, the semiconductor device includes a substrate 300. The substrate 300 may include a seal ring area I and a device area II with the seal ring area I surrounding to the device area II. The substrate 300 may be doped.

The semiconductor device may also include a buried deep-well layer 301. The buried deep-well layer 301 may be situated in the substrate 300 of the seal ring area I and may surround the device area II. The doping type of the buried deep-well layer 301 may be different from the doping type of the substrate 300.

In addition, the semiconductor device may include a well region. The well region may be formed in the portion of the substrate 300 above the buried deep-well layer 301 of the seal ring area I. The well region may include a first well region 302 surrounding the device area II and a second well region 302' surrounding the first well region 302. The first well region 302 and the second well region 302' may both connect with the buried deep-well layer 301 and extend to the surface of the substrate 300. The doping type of the first well region 302 and the second well region 302' may be different from the doping type of the substrate 300.

The semiconductor device may further include a heavily doped region 303. The heavily doped region 303 may be formed in the portion of the substrate 300 surrounded by the first well region 302, the second well region 302', and the buried deep-well layer 301. In addition, the doping type of the heavily doped region 303 may be the same as the doping type of the substrate 300.

Finally, the semiconductor device may include a seal ring structure 400. The seal ring structure 400 may be formed on the substrate 300 and may connect with the heavily doped region 303.

In one embodiment, the substrate 300 may be doped with p-type ions. Correspondingly, the buried deep-well layer 301 may be doped with n-type ions, the first well region 302 and the second well region 302' may also be doped with n-type ions, and the heavily doped region 303 may be doped with p-type ions.

The seal ring area I may have a square shape and may include four corner regions C (referring to FIG. 4). The buried deep-well layer 301, the first well region 302, and the second well region 302' may be formed in the substrate 300 of the seal ring area I but may not be overlapped with any portion of the corner regions C. The seal ring structure 400 may be electrically connected to the substrate 300 at the four corner regions C. Therefore, plasma may be released through the seal ring structure at the four corner regions C, thus damages to the devices due to accumulation of plasma may be avoided.

In one embodiment, the seal ring structure 400 may further include an interlayer dielectric layer 410 formed on the surface of the substrate 300 of the seal ring area I, a plurality of contact hole plugs 420 formed through the entire thickness of the interlayer dielectric layer 410, and a metal interconnection layer 430 formed on the surface of the interlayer dielectric layer 410. The plurality of contact hole plugs 420 may connect with both the heavily doped region 303 and the metal interconnection layer 430.

Further, the metal interconnection layer 430 may further include multiple metal layers 440 formed on the interlayer dielectric layer 410. Referring to FIG. 10 and FIG. 11, each multiple metal layer 440 may include multiple circles of metal lines 445 formed on the interlayer dielectric layer 410. The multiple circles of metal lines 445 may surround the device area II. In addition, along a direction parallel to the substrate 300, a distance L (shown in FIG. 11) between neighboring circles of metal lines 445 may be pre-defined.

The multiple metal layers 440 with each including multiple circles of metal lines 445 may be used to eliminate noise signals. Specifically, after noise signals from RF devices enter the seal ring structure, the noise signals may gradually diminish while passing through the multiple circles of metal lines 445. Therefore, noise signals may not be transmitted in the metal interconnection layer 430, thus the ability of the seal ring structure in resisting noise signals may be further improved.

In one embodiment, the multiple circles of metal lines 445 may be uniformly distributed. That is, the pre-determined distance L between different pairs of neighboring circles of the metal lines 445 of the multiple metal layers 440 may be a constant.

Moreover, the pre-determined distance L may not be very small or excessively large. When the pre-determined distance L is too small, the actual fabrication process may be very difficult and neighboring circles of metal lines 445 may easily connect with each other, affecting the quality of the seal ring structure. On the other hand, when the pre-determined distance L is excessively large, the number of circles allowed for metal lines 445 formed in the seal ring area I may not be large enough to efficiently eliminate noise signals. In one embodiment, the pre-determined distance L is in a range of 500 μm to 1000 μm; and the number of circles of metal lines 445 formed in the seal ring area I is 4.

The metal interconnection layer 430 may be made of Cu, W, and/or Al. In one embodiment, the metal interconnection layer 430 is made of Cu.

Moreover, the semiconductor device may also include a connection metal layer 500 formed on the surface of the seal ring structure 400. The connection metal layer 500 may be connected to ground through another connection metal layer 600.

The connection metal layer 500 may be used to electrically connect different components and also connect components to external electric circuits. In one embodiment, the connection metal layer 500 may be made of Al.

Further, prior to the formation of the connection metal layer 500 on the surface of the seal ring structure 400, the fabrication method may also include the following steps. First, a second passivation layer 720 may be formed on the surface of the connection metal layer 500. An opening (not shown) may be formed in the second passivation layer 720. The opening may expose a portion of the connection metal layer 500. Finally, the connection metal layer 500 may be connected to another connection metal layer 600 through the opening and the connection metal layer 600 may be grounded.

Because noise signals may originate from the potential difference between a high voltage and a low voltage, by connecting the connection metal layer 500 to ground through the connection metal layer 600, potential difference in the seal ring structure 400 may be avoided. Therefore, noise signals may not be generated, thus the electrical performance of semiconductor device may be improved.

According to existing semiconductor device and the fabrication method, a seal ring structure is usually formed on the substrate. The seal ring structure may be connected to a heavily doped region in the semiconductor device. Noise signal may easily enter the seal ring structure through the heavily doped region from the seal ring structure. Because the device area and the seal ring area of the semiconductor device are both on a same substrate, after entering the substrate, the noise signal may further affect the performance of other components in the semiconductor device.

According to the disclosed semiconductor device and the fabrication method, a buried deep-well layer, a first well region, and a second well region may be formed in the disclosed semiconductor device to provide an anti jamming barrier. Further, the doping type of the buried deep-well layer, the first well region, and the second well region may be different from the doping type of the substrate. Therefore, the anti jamming barrier formed by the buried deep-well layer, the first well region, and the second well region may isolate the substrate of the seal ring area from other components formed in the device area, preventing noise signals from entering the substrate through the seal ring structure and thus affecting the electrical performance of other components.

In addition, according to the disclosed semiconductor device and the fabrication method, the seal ring structure in the semiconductor device may be capable for preventing moisture from entering the chip and also preventing ionic contamination. Moreover, the seal ring structure may prevent the chip from damage during dicing process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a substrate including a device area and a seal ring area surrounding the device area;
   forming a buried deep-well layer in the substrate of the seal ring area to surround the device area, wherein the buried deep-well layer has a first doping type different from a second doping type of the substrate;
   forming a first well region and a second well region in the substrate above the buried deep-well layer in the seal ring area with the first well region surrounding the device area and the second well region surrounding the first well region,
      wherein each of the first well region and the second well region connects with the buried deep-well layer and extends to a surface of the substrate, and each of the first well region and the second well region has the first doping type;
   forming a heavily doped region in a portion of the substrate above the buried deep-well layer and sandwiched by the first well region and the second well region wherein the heavily doped region has the second doping type and extends to the surface of the substrate; and
   forming a seal ring structure on the substrate of the seal ring area with the seal ring structure connected to the heavily doped region.

2. The method for fabricating the semiconductor device according to claim 1, wherein:
   the substrate is doped with p-type ions;
   the buried deep-well layer, the first well region, and the second well region are doped with n-type ions; and
   the heavily doped region is doped with p-type ions.

3. The method for fabricating the semiconductor device according to claim 2, wherein the first well region and the second well region are formed by a second ion implantation performed on the substrate of the seal ring area with process parameters including:
   implanting ions, including phosphor ions, arsenic ions, and antimony ions;
   an implanting energy in a range of 100 keV to 500 keV; and
   an implanting dosage in a range of 5E12 atoms/cm$^2$ to 1E14 atoms/cm$^2$.

4. The method for fabricating the semiconductor device according to claim 3, wherein the seal ring area has a square shape and includes four corner regions, and the second ion implantation process to form the first well region and the second well region includes:
   forming a second patterned layer on the surface of the substrate to cover the device area and a portion of the seal ring area including the four corner regions and expose only a portion of the substrate surface above the buried deep-well layer of the seal ring area;
   performing the second ion implantation process on the portion of the substrate exposed by the second patterned layer to form the first well region in the substrate above the buried deep-well layer to surround the seal ring area and the second well region to surround the first well region; and
   removing the second patterned layer.

5. The method for fabricating the semiconductor device according to claim 2, wherein the heavily doped region is formed by a heavy doping implantation process with process parameters including:
   implanting ions, including boron ions, gallium ions, and indium ions;
   an implanting energy in a range of 1 keV to 100 keV; and
   an implanting dosage in a range of 5E14 atoms/cm$^2$ to 1E16 atoms/cm$^2$.

6. The method for fabricating the semiconductor device according to claim 5, wherein the seal ring area has a square shape and includes four corner regions, and the heavy doping implantation process to form the heavily doped region includes:
   forming a third patterned layer on the surface of the substrate to cover the device area, the four corner regions of the seal ring area, the first well region, and the second well region;
   performing the heavy doping implantation process on a portion of the substrate exposed by the third patterned layer to form the heavily doped region in the substrate above the buried deep-well layer; and
   removing the third patterned layer.

7. The method for fabricating the semiconductor device according to claim 1, wherein forming the seal ring structure on the substrate includes:
   forming an interlayer dielectric layer on the surface of the seal ring area;
   forming a plurality of contact hole plugs through an entire thickness of the interlayer dielectric layer with the plurality of contact hole plugs connected to the heavily doped region; and
   forming a metal interconnection layer on the surface of the interlayer dielectric layer with the metal interconnection layer connected to the plurality of contact hole plugs.

8. The method for fabricating the semiconductor device according to claim 7, wherein:
forming the metal interconnection layer includes forming multiple metal layers;
forming each metal layer includes forming multiple circles of metal lines to surround the device area; and
along a direction parallel to the surface of the substrate, a distance between neighboring circles of the metal lines is pre-determined.

9. The method for fabricating the semiconductor device according to claim 8, further including:
a constant pre-determined distance between neighboring circles of metal wires.

10. The method for fabricating the semiconductor device according to claim 8, wherein the pre-determined distance is in a range of 500 μm to 1000 μm.

11. The method for fabricating the semiconductor device according to claim 1, after forming the seal ring structure on the surface of the substrate, further including:
forming a connection metal layer on a surface of the seal ring structure; and
connecting the connection metal layer to ground.

12. The method for fabricating the semiconductor device according to claim 11, wherein the connection metal layer is made of aluminum.

13. The semiconductor device according to claim 1, further including a grounded connection metal layer formed on a surface of the seal ring structure.

14. A method for fabricating a semiconductor device, comprising:
providing a substrate including a device area and a seal ring area surrounding the device area;
forming a buried deep-well layer in the substrate of the seal ring area to surround the device area, wherein the buried deep-well layer has a first doping type different from a second doping type of the substrate;
forming a first well region and a second well region in the substrate above the buried deep-well layer in the seal ring area with the first well region surrounding the device area and the second well region surrounding the first well region,
wherein each of the first well region and the second well region connects with the buried deep-well layer and extends to a surface of the substrate, and each of the first well region and the second well region has the first doping type;
forming a heavily doped region in a portion of the substrate above the buried deep-well layer and between the first well region and the second well region wherein the heavily doped region has the second doping type; and
forming a seal ring structure on the substrate of the seal ring area with the seal ring structure connected to the heavily doped region, wherein
the substrate is doped with p-type ions;
the buried deep-well layer, the first well region, and the second well region are doped with n-type ions;
the heavily doped region is doped with p-type ions; and
the buried deep-well layer is formed by a first ion implantation process performed on the substrate of the seal ring area with process parameters including:
implanting ions, including phosphor ions, arsenic ions, and antimony ions;
an implanting energy in a range of 100 keV to 1000 keV; and
an implanting dosage in a range of 1E12 atoms/cm² to 1E14 atoms/cm².

15. The method for fabricating the semiconductor device according to claim 14, wherein the seal ring area has a square shape and includes four corner regions, and the first ion implantation process to form the buried deep-well layer includes:
forming a first patterned layer on the surface of the substrate to cover the device area and the four corner regions of the seal ring area;
performing the first ion implantation process on a portion of the substrate exposed by the first patterned layer to form the buried deep-well layer in the substrate; and
removing the first patterned layer.

16. A semiconductor device, comprising:
a substrate including a device area and a seal ring area surrounding the device area;
a buried deep-well layer formed in the substrate of the seal ring area to surround the device area, wherein the buried deep-well layer has a first doping type different from a second doping type of the substrate;
a first well region and a second well region formed in the substrate above the buried deep-well layer in the seal ring area with the first well region surrounding the device area and the second well region surrounding the first well region,
wherein each of the first well region and the second well region connects with the buried deep-well layer and extends to a surface of the substrate, and each of the first well region and the second well region has the first doping type;
a heavily doped region formed in a portion of the substrate above the buried deep-well layer and sandwiched by the first well region and the second well region, wherein the heavily doped region has the second doping type and extends to the surface of the substrate; and
a seal ring structure formed on the substrate of the seal ring area with the seal ring structure connected to the heavily doped region.

17. The semiconductor device according to claim 16, wherein:
the substrate is doped with p-type ions;
the buried deep-well layer, the first well region, and the second well region are doped with n-type ions; and
the heavily doped region is doped with p-type ions.

18. The semiconductor device according to claim 16, wherein the seal ring structure further includes:
an interlayer dielectric layer formed on the surface of the seal ring area;
a plurality of contact hole plugs formed through an entire thickness of the interlayer dielectric layer with the plurality of contact hole plugs connected to the heavily doped region; and
a metal interconnection layer formed on the surface of the interlayer dielectric layer with the metal interconnection layer connected to the plurality of contact hole plugs.

19. The semiconductor device according to claim 18, wherein:
the metal interconnection layer includes multiple metal layers;
each metal layer includes multiple circles of metal surrounding the device area; and
along a direction parallel to the surface of the substrate, a distance between neighboring circles of the metal lines is pre-determined.

20. The semiconductor device according to claim 19, wherein the pre-determined distance is in a range of 500 μm to 1000 μm.

* * * * *